(12) United States Patent
Yun et al.

(10) Patent No.: US 8,411,478 B2
(45) Date of Patent: Apr. 2, 2013

(54) THREE-DIMENSIONAL STACKED SEMICONDUCTOR INTEGRATED CIRCUIT

(75) Inventors: Tae Sik Yun, Ichon-shi (KR); Young Jun Ku, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 160 days.

(21) Appl. No.: 12/970,907

(22) Filed: Dec. 16, 2010

(65) Prior Publication Data

US 2012/0081984 A1    Apr. 5, 2012

(30) Foreign Application Priority Data

Sep. 30, 2010    (KR) .................. 10-2010-0095661

(51) Int. Cl.
*G11C 5/06* (2006.01)
(52) U.S. Cl. ..................................... 365/63; 365/230.06
(58) Field of Classification Search .................... 365/63, 365/230.06; 327/77
See application file for complete search history.

(56) References Cited

U.S. PATENT DOCUMENTS

| 2009/0039492 | A1 | 2/2009 | Kang et al. |
| 2010/0020583 | A1 | 1/2010 | Kang et al. |
| 2010/0102453 | A1 | 4/2010 | Tseng et al. |
| 2010/0148316 | A1 | 6/2010 | Kim et al. |
| 2010/0225002 | A1 | 9/2010 | Law et al. |
| 2010/0315887 | A1* | 12/2010 | Park .......................... 365/189.07 |
| 2012/0007624 | A1* | 1/2012 | Byeon et al. ............. 324/750.15 |
| 2012/0124532 | A1* | 5/2012 | Coteus et al. ................. 716/104 |

FOREIGN PATENT DOCUMENTS

| JP | 2005122823 A | 5/2005 |
| JP | 2007265548 A | 10/2007 |
| JP | 2010-109264 | 5/2010 |
| JP | 2010-114165 | 5/2010 |
| KR | 1020050076682 A | 7/2005 |
| KR | 1020100095515 A | 8/2010 |

\* cited by examiner

*Primary Examiner* — Vu Le
(74) *Attorney, Agent, or Firm* — William Park & Associates Ltd.

(57) ABSTRACT

Various embodiments of a three-dimensional, stacked semiconductor integrated circuit are disclosed. In one exemplary embodiment, the circuit may include a master slice, a plurality of slave slices, and a plurality of through-silicon vias for connecting the master slice to the plurality of slave slices. At least one of the plurality of through-silicon vias may be configured to transmit an operation control signal from the master slice to the plurality of slave slices. The at least one of the plurality of through-silicon vias is configured to be shared by the plurality of slave slices.

19 Claims, 6 Drawing Sheets ated circuit 1 may include a plurality of slices
THREE-DIMENSIONAL STACKED SEMICONDUCTOR INTEGRATED CIRCUIT

CROSS-REFERENCE TO RELATED APPLICATION

The present application claims priority under 35 U.S.C. §119(a) to Korean Patent Application No. 10-2010-95661, filed on Sep. 30, 2010, in the Korean Intellectual Property Office, which is incorporated herein by reference in its entirety as if set forth in full.

BACKGROUND

1. Technical Field

Various embodiments of the present invention relate to a semiconductor circuit and, more particularly, to a three-dimensional stacked semiconductor integrated circuit.

2. Related Art

A semiconductor integrated circuit generally includes two or more chips for purposes of improving integration efficiency. Recently, there has been developed a three-dimensional, stacked semiconductor integrated circuit having an interface of a plurality of chips by using through-silicon vias (TSVs).

FIG. 1 is a cross-sectional view of a conventional three-dimensional, stacked semiconductor integrated circuit. Referring to FIG. 1, a three-dimensional stacked semiconductor integrated circuit 1 may include a plurality of slices (e.g., a plurality of chips CHIP0 to CHIP3) stacked on a substrate 2 and connected to one another through a plurality of TSVs.

FIG. 2 is a block diagram of a conventional three-dimensional, stacked semiconductor integrated circuit. As shown in FIG. 2, a three-dimensional stacked semiconductor integrated circuit 10 may include a plurality of slices coupled to one another through a plurality of TSVs.

The plurality of slices may include a master slice MASTER_SLICE 20 and a plurality of slave slices SLAVE_SLICE0 to SLAVE_SLICE3. For simplicity, FIG. 2 illustrates only one slave slice SLAVE_SLICE3 30. Each of slave slices SLAVE_SLICE0 to SLAVE_SLICE3 may include a plurality of memory banks.

Master slice MASTER_SLICE 20 includes a decoding block 21 and a driver 22. Decoding block 21 decodes a command CMD by using a clock signal CLK to generate active control signals RACT<0:15>_S0 to RACT<0:15>_S3. Driver 22 drives active control signals RACT<0:15>_S0 to RACT<0:15>_S3 and transmits the driven active control signals RACT<0:15>_S0 to RACT<0:15>_S3 through the plurality of TSVs.

Slave slice SLAVE_SLICE3 includes a receiver 31 and a bank control unit 32. Receiver 31 receives active control signal RACT<0:15>_S3 related to receiver 31 among active control signals RACT<0:15>_S0 to RACT<0:15>_S3 transmitted through the plurality of TSVs, and transmits active control signal RACT<0:15>_S3 to bank control unit 32.

Bank control unit 32 controls the active and precharge operations of a corresponding memory bank in response to active control signal RACT<0:15>_S3.

As shown in FIG. 2, among active control signals RACT<0:15>_S0 to RACT<0:15>_S3, active control signal RACT<0>_S3 for controlling the active and precharge operations of $0^{th}$ bank of a third slice SLICE3 is a level signal. That is, active control signal RACT<0>_S3 defines the active of a corresponding bank during a high level duration and defines the precharge of the corresponding bank during a low level duration.

As described above, since active control signals RACT<0:15>_S0 to RACT<0:15>_S3 are duration signals, if one of them influences other signals, a certain memory bank may be switched to operation states different from the associated command. For this reason, active control signals RACT<0:15>_S0 to RACT<0:15>_S3 are independently transmitted.

Active control signals RACT<0:15>_S0 to RACT<0:15>_S3 include four slave slices SLAVE_SLICE0 to SLAVE_SLICE3, each of which includes 16 memory banks. Thus, active control signals RACT<0:15>_S0 to RACT<0:15>_S3 are based on a total of 64 memory banks. Accordingly, in order to transmit active control signals RACT<0:15>_S0 to RACT<0:15>_S3, a total of 64 TSVs are required.

In the above-described conventional semiconductor integrated circuit, TSVs corresponding to the number of memory banks are required in order to transfer the active control signals from the master slice to the slave slices.

Although not shown in the drawings, in addition to active control signals RACT<0:15>_S0 to RACT<0:15>_S3, a plurality of TSVs such as TSVs for data transfer are provided between the master slice and the slave slices.

SUMMARY

Accordingly, there is a need for an improved a three-dimensional stacked semiconductor integrated circuit that may obviate one or more of the above-mentioned problems or disadvantages. In particular, there is a need for a three-dimensional stacked semiconductor integrated circuit that may allow reduction of the number of required TSVs. It should be understood that some aspects of the invention may not necessarily obviate all of those problems or disadvantages.

In the following description, certain aspects and embodiments will become evident. It should be understood that these aspects and embodiments are merely exemplary, and the invention, in its broadest sense, could be practiced without having one or more features of these aspects and embodiments.

To attain the advantages and in accordance with the purpose of the invention, as embodied and broadly described herein, one aspect of the invention may provide a three-dimensional stacked semiconductor integrated circuit comprising: a master slice; a plurality of slave slices; and a plurality of through-silicon vias for connecting the master slice to the plurality of slave slices. At least one of the plurality of through-silicon vias is configured to transmit an operation control signal from the master slice to the plurality of slave slices. The at least one of the plurality of through-silicon vias is configured to be shared by the plurality of slave slices.

In another exemplary aspect of the invention, a three-dimensional stacked semiconductor integrated circuit may include: a master slice configured to generate a master active control signal and a slice selection signal in response to a command and generate a pulse signal based on the master active control signal; a plurality of slave slices configured to convert the pulse signal to a slave active control signal in response to the slice selection signal; and a plurality of TSVs configured to be commonly connected between to the master slice and the plurality of slave slices for transferring the pulse signal and the slice selection signal.

Some exemplary aspects may provide a method of controlling a stacked semiconductor integrated circuit having a master slice and a plurality of slave slices. The method may comprise: generating a master active control signal and a slice selection signal in response to a command; generating a pulse signal based on the master active control signal in the master slice; transmitting the master active control signal and the slice selection signal to the plurality of slave slices through a plurality of through-silicon vias; sharing at least one of the plurality of through-silicon vias by at least two of the slave slices; and converting the pulsed signal to a slave active control signal in response to the slice selection signal in each of the plurality of slave slices.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
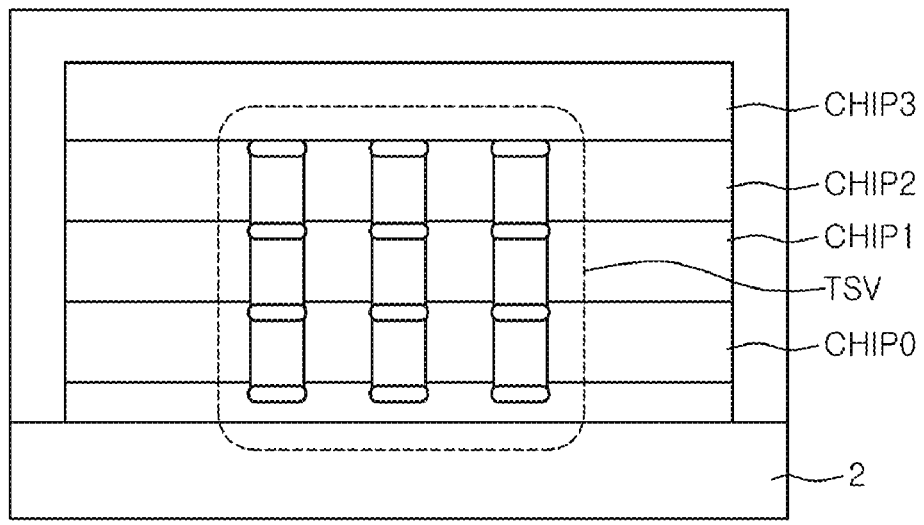
FIG. 1 is a cross-sectional view of a conventional three-dimensional stacked semiconductor integrated circuit.
Figure 2:
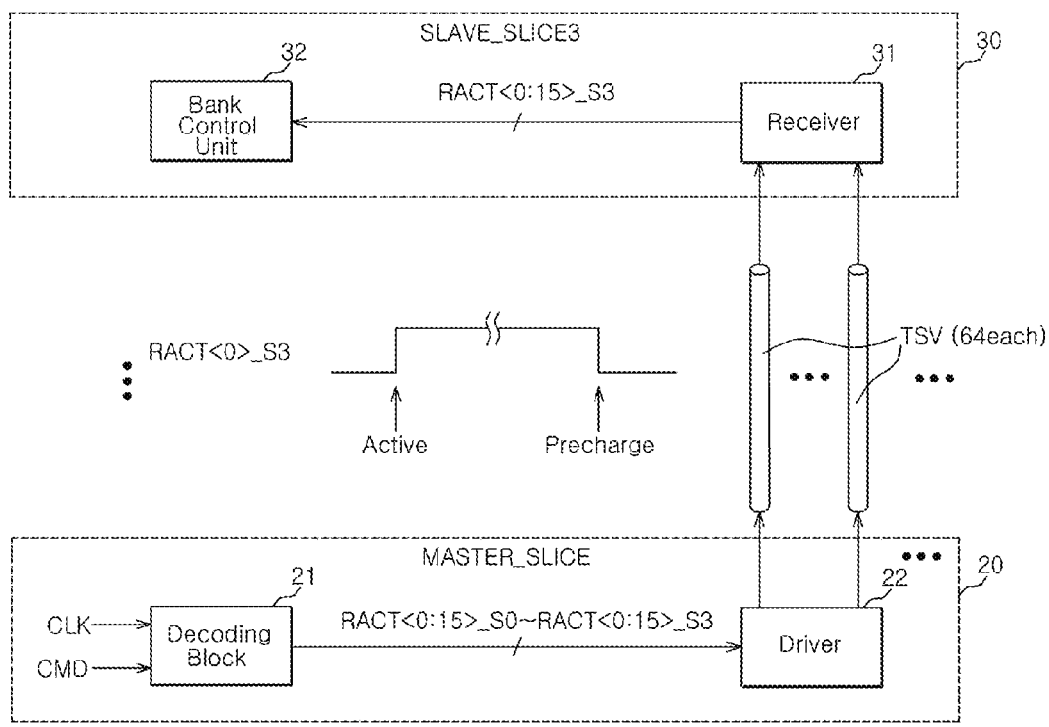
FIG. 2 is a block diagram of a conventional three-dimensional stacked semiconductor integrated circuit.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 3:
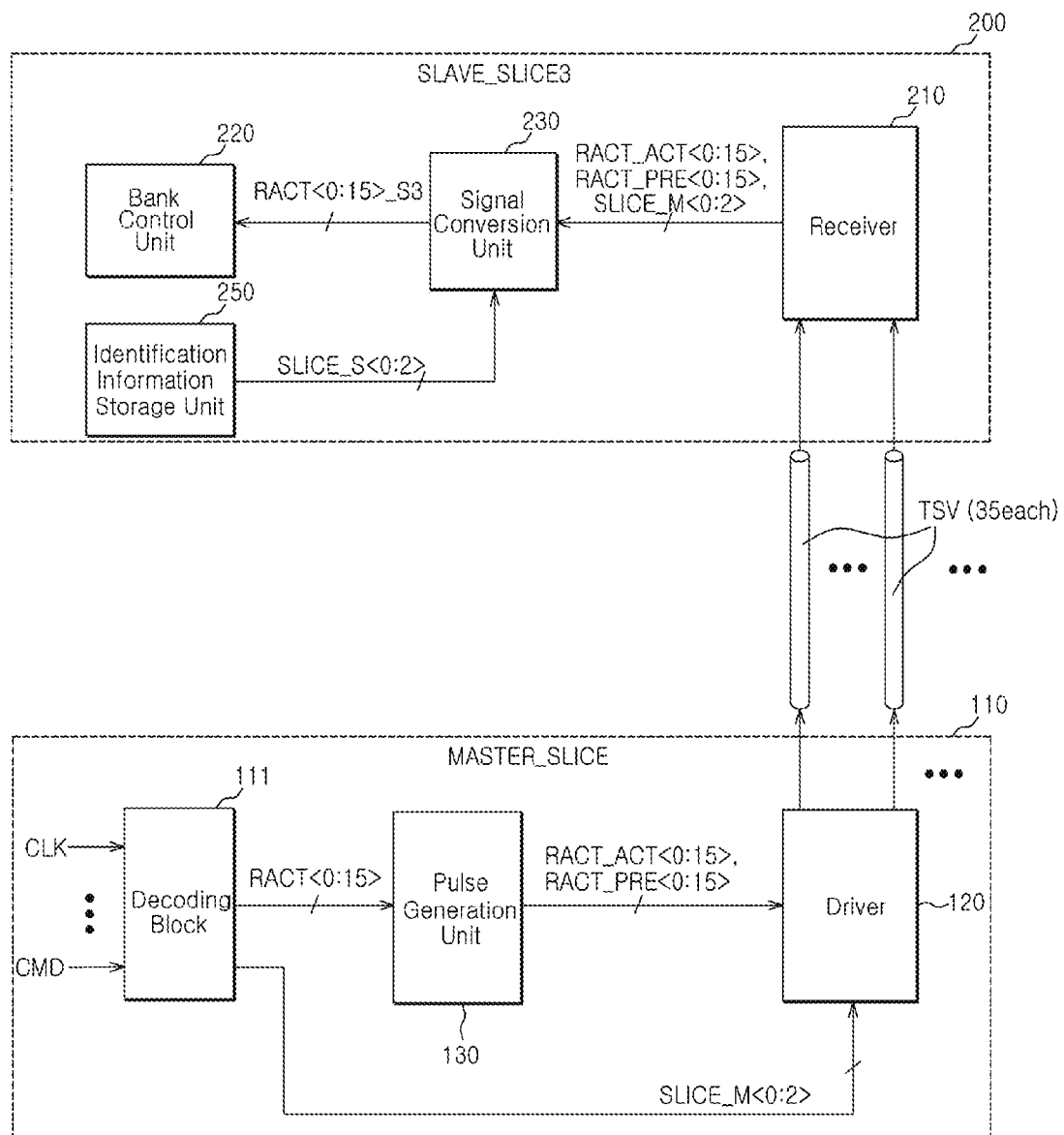
FIG. 3 is a block diagram of a three-dimensional stacked semiconductor integrated circuit according to one exemplary embodiment of the invention.

FIG. 3 is a block diagram of a three-dimensional, stacked semiconductor integrated circuit according to one exemplary embodiment of the invention. A three-dimensional stacked semiconductor integrated circuit 100, according to one exemplary embodiment of the invention, may include a master slice MASTER_SLICE 110 and a plurality of slave slices SLAVE_SLICE0 to SLAVE_SLICE3. Each of the plurality of slave slices SLAVE_SLICE0 to SLAVE_SLICE3 includes a plurality of memory banks.

Master slice MASTER_SLICE 110 and the plurality of slave slices SLAVE_SLICE0 to SLAVE_SLICE3 are connected to one another through a plurality of TSVs. FIG. 3 illustrates slave slice SLAVE_SLICE3 200 only for simplicity.

The plurality of slave slices SLAVE_SLICE0 to SLAVE_SLICE3 are configured to share TSVs used for transmitting an operation control signal from master slice MASTER_SLICE 110 to the plurality of slave slices SLAVE_SLICE0 to SLAVE_SLICE3.

At this time, the operation control signal may include pulse signals RACT_ACT<0:15> and RACT_PRE<0:15> and slice selection signals SLICE_M<0:2>.

The active control signal is used to independently control the active and precharge operations of all memory banks of the plurality of slave slices SLAVE_SLICE0 to SLAVE_SLICE3.

Master slice 110 is configured to generate master active control signals RACT<0:15> and slice selection signals SLICE_M<0:2> in response to a command CMD. Master slice 110 is also configured to generate pulse signals RACT_ACT<0:15> and RACT_PRE<0:15> based on master active control signals RACT<0:15>. At this time, pulse signals RACT_ACT<0:15> are used to define active start timing, and pulse signals RACT_PRE<0:15> are used to define precharge start timing.

The plurality of slave slices SLAVE_SLICE0 to SLAVE_SLICE3 may have substantially the same configuration from one another.

As an example, slave slice SLAVE_SLICE3 may be configured to convert pulse signals RACT_ACT<0:15> and RACT_PRE<0:15> to slave active control signals RACT<0:15>_S3 in response to slice selection signals SLICE_M<0:2> and use slave active control signals RACT<0:15>_S3 to control the memory banks.

Slave slice SLAVE_SLICE3 is also configured to convert pulse signals RACT_ACT<0:15> and RACT_PRE<0:15> to slave active control signals RACT<0:15>_S3 when slice selection signals SLICE_M<0:2> coincide with its own slice identification information SLICE_S<0:2>.

The plurality of TSVs are configured to be shared by both master slice MASTER_SLICE 110 and the plurality of slave slices SLAVE_SLICE0 to SLAVE_SLICE3, thereby enabling transfer of pulse signals RACT_ACT<0:15> and RACT_PRE<0:15> and slice selection signals SLICE_M<0:2> therebetween.

Master slice MASTER_SLICE 110 may include a decoding block 111, a pulse generation unit 130, and a driver 120.

Decoding block 111 is configured to decode a command CMD based on a clock signal CLK and generate master active control signals RACT<0:15> and slice selection signals SLICE_M<0:2>.

Pulse generation unit 130 is configured to generate pulse signals RACT_ACT<0:15> and RACT_PRE<0:15> based on master active control signals RACT<0:15>.

Driver 120 is configured to drive pulse signals RACT_ACT<0:15> and RACT_PRE<0:15> and slice selection signals SLICE_M<0:2> and transmit driven pulse signals RACT_ACT<0:15> and RACT_PRE<0:15> and slice selection signals SLICE_M<0:2> through the plurality of TSVs.

Driver 120 is also configured to convert the voltage level of an output signal of pulse generation unit 130 to a voltage level at which the output signal can be transmitted through the plurality of TSVs.

Slave slice SLAVE_SLICE3 200 may include a receiver 210, a signal conversion unit 230, a bank control unit 220, and an identification information storage unit 250.

Receiver 210 is configured to receive pulse signals RACT_ACT<0:15> and RACT_PRE<0:15> and slice selection signals SLICE_M<0:2> which have been transmitted through the plurality of TSVs. Receiver 210 is also configured to convert the voltage levels of the signals transmitted through the TSVs to voltage levels at which signal conversion unit 230 can process the signals.

Signal conversion unit 230 is configured to convert pulse signals RACT_ACT<0:15> and RACT_PRE<0:15> to slave active control signals RACT<0:15>_S3 when slice selection signals SLICE_M<0:2> coincide with its own slice identification information SLICE_S<0:2>.

Bank control unit 220 is configured to control the active and precharge operations of a corresponding memory bank in response to slave active control signals RACT<0:15>_S3.

Identification information storage unit 250 is configured to store slice identification information SLICE_S<0:2> and may include a register or a fuse set.

Figure 4:
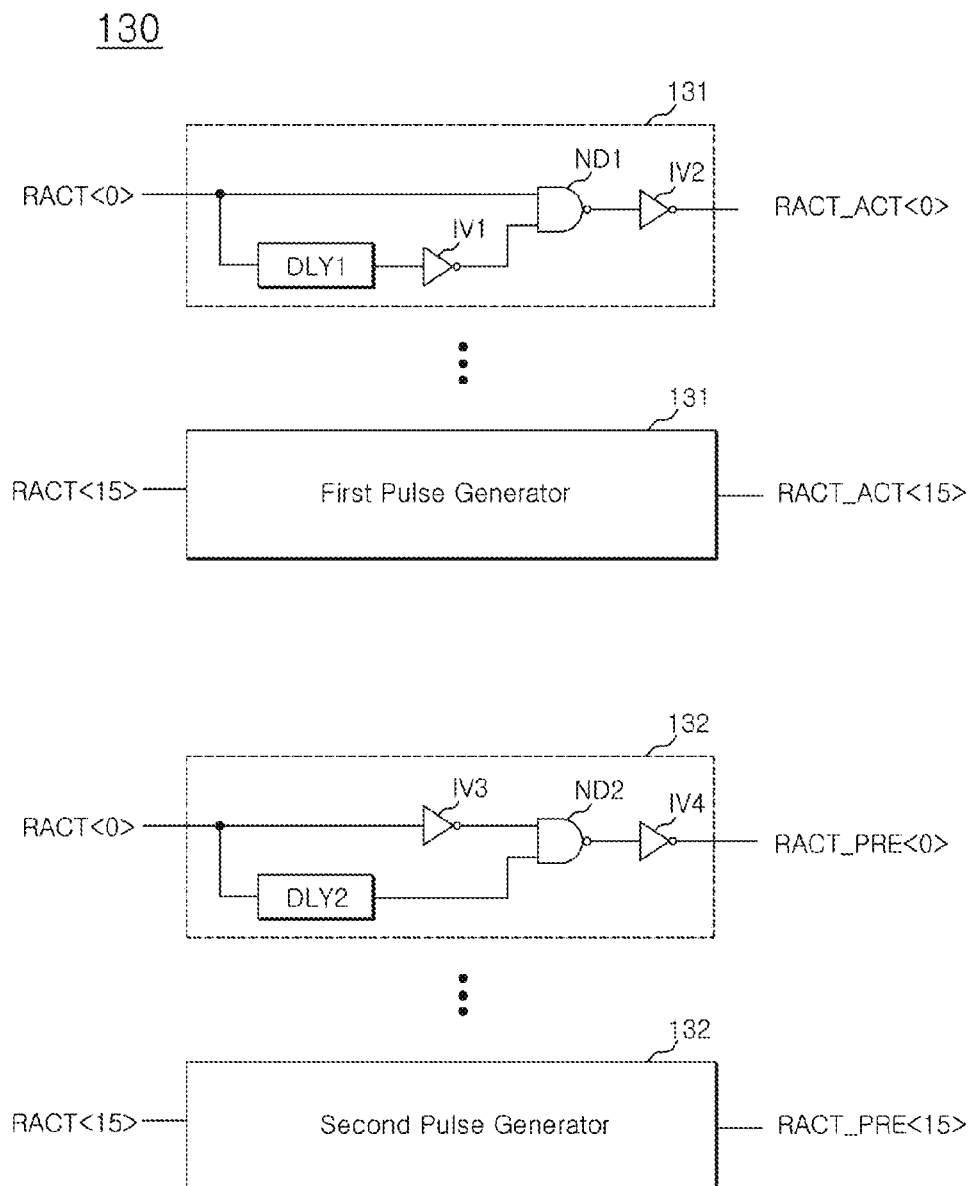
FIG. 4 is a circuit diagram of an exemplary pulse generation unit illustrated in FIG. 3.

FIG. 4 illustrates an exemplary embodiment of pulse generation unit 130 shown in FIG. 3. As shown in FIG. 4, pulse generation unit 130 may include a plurality of first pulse generators 131 and a plurality of second pulse generators 132.

First pulse generators 131 are configured to generate, in response to the rising edges of master active control signals RACT<0:15>, pulse signals RACT_ACT<0:15> having pulse widths corresponding to delay units DLY1 and defining active start timing. Each of first pulse generators 131 may include delay unit DLY1, a plurality of inverters IV1 and IV2, and a NAND gate ND1.

Second pulse generators 132 are configured to generate, in response to the falling edges of master active control signals RACT<0:15>, pulse signals RACT_PRE<0:15> having pulse widths corresponding to delay units DLY2 and defining precharge start timing. Each of second pulse generators 132 may include delay unit DLY2, a plurality of inverters IV3 and IV4, and a NAND gate ND2.

Figure 5:
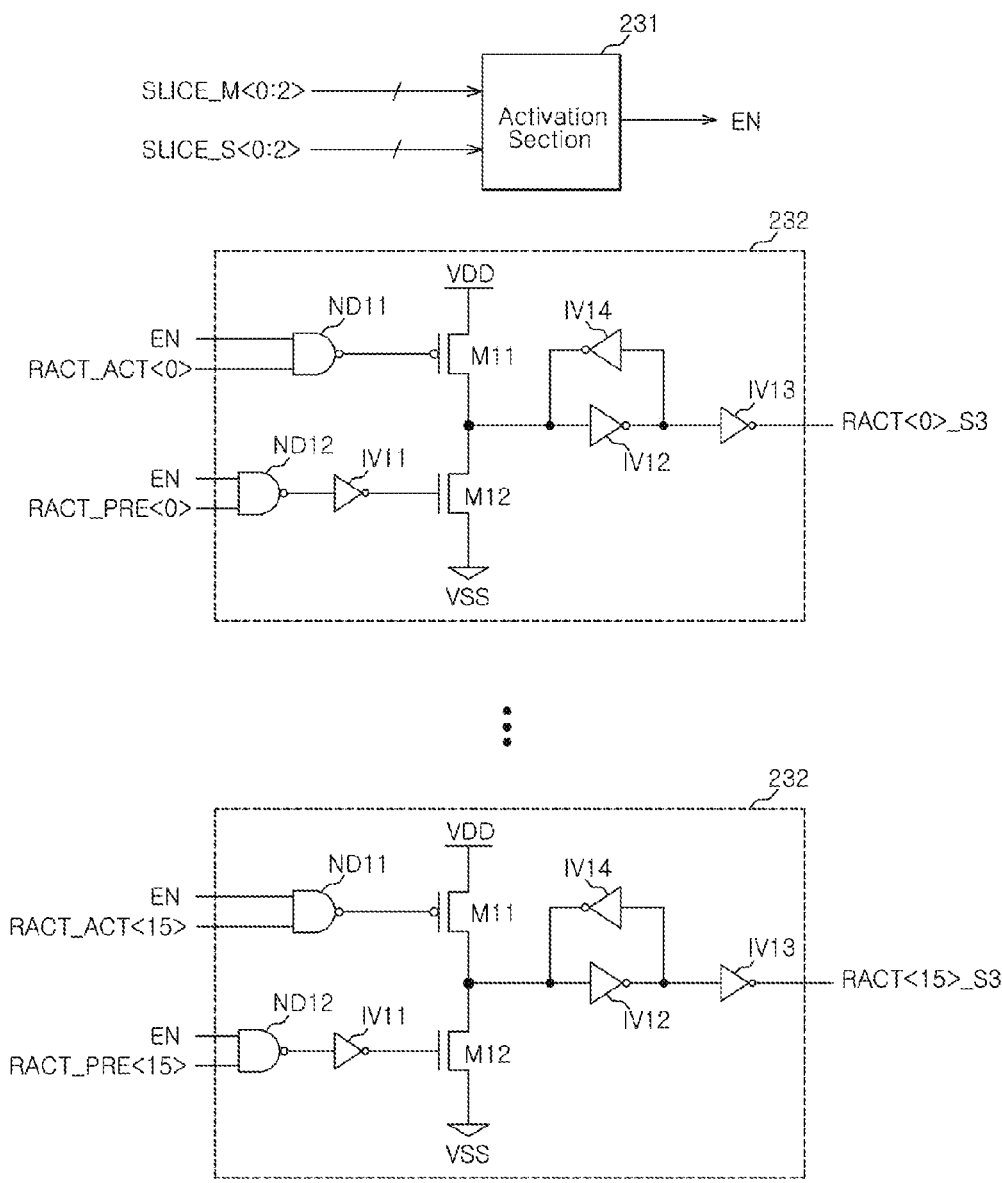
FIG. 5 is a circuit diagram of an exemplary signal conversion unit illustrated in FIG. 3.

FIG. 5 illustrates an exemplary embodiment of signal conversion unit 230 shown in FIG. 3. As shown in FIG. 5, signal conversion unit 230 may include an activation section 231 and a plurality of signal conversion sections 232.

Activation section 231 is configured to activate a selection activation signal EN when slice selection signals SLICE_M<0:2> coincide with slice identification information SLICE_S<0:2>. In some exemplary embodiments, activation section 231 may include an XNOR gate.

Signal conversion sections 232 are configured to convert pulse signals RACT_ACT<0:15> and RACT_PRE<0:15> to slave active control signals RACT<0:15>_S3 when selection activation signal EN is activated. Each signal conversion section 232 may include a plurality of NAND gates ND11 and ND12, a plurality of inverters IV11 to IV14, and a plurality of transistors M11 and M12.

Since pulse signals RACT_ACT<0:15> are inputted when selection activation signal EN is activated, transistor M11 is turned on, and slave active control signals RACT<0:15>_S3 are changed to a high level and are latched by using inverter IV14.

Similarly, since pulse signals RACT_PRE<0:15> are inputted when selection activation signal EN is activated, transistor M12 is turned on, and slave active control signals RACT<0:15>_S3 are changed to a low level and are latched by using inverter IV14.

Figure 6:
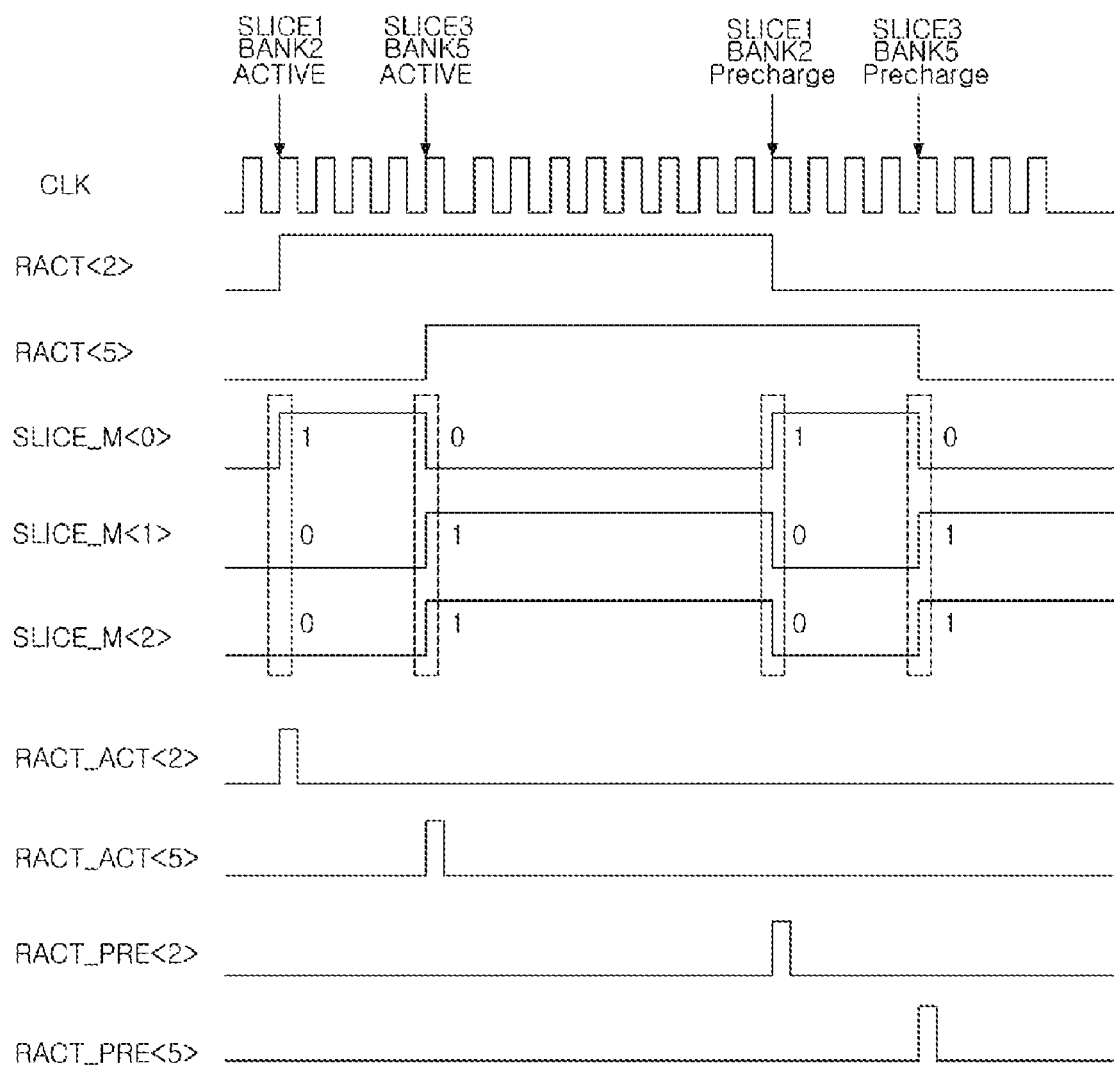
FIG. 6 is a diagram illustrating the operation timing of a three-dimensional stacked semiconductor integrated circuit according to various exemplary embodiments of the invention.

FIG. 6 is a diagram illustrating the operation timing of a three-dimensional stacked semiconductor integrated circuit according to various exemplary embodiments of the invention. With reference to FIG. 6, an exemplary control operation of a three-dimensional stacked semiconductor integrated circuit, consistent with various embodiments of the invention, will be described herein.

Initially, the plurality of slave slices SLAVE_SLICE0 to SLAVE_SLICE3 store specific slice identification information SLICE_S<0:2>. For illustration purposes only, it is assumed that slice identification information SLICE_S<0:2> of slave slice SLAVE_SLICE1 is '100' and slice identification information SLICE_S<0:2> of slave slice SLAVE_SLICE3 is '011'.

Master slice 100 decodes command CMD (e.g., SLICE1/BANK2/ACTIVE) to generate pulse signals RACT_ACT<0:15> and RACT_PRE<0:15> and slice selection signals SLICE_M<0:2>. At this time, pulse signal RACT_ACT<2> of pulse signals RACT_ACT<0:15> and RACT_PRE<0:15> is activated, and slice selection signals SLICE_M<0:2> have a value of '100'.

Pulse signals RACT_ACT<0:15> and RACT_PRE<0:15> and slice selection signals SLICE_M<0:2> are commonly transmitted to the plurality of slave slices SLAVE_SLICE0 to SLAVE_SLICE3 through the plurality of TSVs.

Among the plurality of slave slices SLAVE_SLICE0 to SLAVE_SLICE3, only slave slice SLAVE_SLICE1 storing slice identification information SLICE_S<0:2> with a value of '100' converts pulse signal RACT_ACT<2> to slave active control signal RACT<2>_S1 and provides bank control unit 220 with slave active control signal RACT<2>_S1. Thus, memory bank BANK2 of slave slice SLAVE_SLICE1 is changed to an active state.

After a predetermined timing margin, master slice 100 decodes command CMD (e.g., SLICE3/BANK5/ACTIVE) to generate pulse signals RACT_ACT<0:15> and RACT_PRE<0:15> and slice selection signals SLICE_M<0:2>.

At this time, pulse signal RACT_ACT<5> of pulse signals RACT_ACT<0:15> and RACT_PRE<0:15> is activated, and slice selection signals SLICE_M<0:2> have a value of '011'.

Pulse signals RACT_ACT<0:15> and RACT_PRE<0:15> and slice selection signals SLICE_M<0:2> are commonly transmitted to the plurality of slave slices SLAVE_SLICE0 to SLAVE_SLICE3 through the plurality of TSVs.

Among the plurality of slave slices SLAVE_SLICE0 to SLAVE_SLICE3, only slave slice SLAVE_SLICE3 storing slice identification information SLICE_S<0:2> with a value of '011' converts pulse signal RACT_ACT<5> to slave active control signal RACT<5>_S3 and provides bank control unit 220 with slave active control signal RACT<5>_S3. Thus, memory bank BANK5 of slave slice SLAVE_SLICE3 is changed to an active state.

Then, master slice 100 generates pulse signals RACT_ACT<0:15> and RACT_PRE<0:15> and slice selection signals SLICE_M<0:2> in response to command CMD (e.g., SLICE1/BANK2/PRECHARGE) and command CMD (e.g., SLICE3/BANK5/PRECHARGE), which are sequentially inputted.

Similarly to the active operation, memory bank BANK2 of slave slice SLAVE_SLICE1 is precharged, and then memory bank BANK5 of slave slice SLAVE_SLICE3 is precharged.

Thus, while the conventional semiconductor integrated circuit described above required a total of 64 TSVs in order to independently control the active and precharge operations of the plurality of slave slices, the various embodiments of the invention may allow reduction in the number of required TSVs because pulse signals RACT_ACT<0:15> and RACT_PRE<0:15> are shared by the plurality of slave slices SLAVE_SLICE0 to SLAVE_SLICE3. For example, in the disclosed embodiments, only a total of 35 TSVs are required.

The difference in the number of required TSVs between the conventional art and the present disclosure is based on an assumption that a total of 64 memory banks (16 memory banks in 4 slave slices) are included in a system. The difference in the number of required TSVs may significantly increase as the memory capacity is increased.

It should be understood that the active and precharge operations are exemplary only and that the disclosed embodiments can be applied to other operations.

According to one aspect of the invention, it is possible to control the operations of slaves by using a smaller number of TSVs as compared to the number of TSVs used in the conventional art.

According to another aspect of the invention, a master slice transfers a pulse type signal to slave slices to allow TSVs to be shared, so that the total number of TSVs can be reduced, resulting in an increase in a layout margin and improvement in convenience of circuit design.

While certain embodiments have been described above, it will be understood to those skilled in the art that the embodiments described are by way of example only. Accordingly, the three-dimensional stacked semiconductor integrated circuit described herein should not be limited based on the described embodiments. Rather, the three-dimensional stacked semiconductor integrated circuit described herein should only be limited in light of the claims that follow when taken in conjunction with the above description and accompanying drawings.

What is claimed is:

1. A three-dimensional stacked semiconductor integrated circuit comprising:
   a master slice;
   a plurality of slave slices; and
   a plurality of through-silicon vias for connecting the master slice to the plurality of slave slices, at least one of the plurality of through-silicon vias being configured to transmit an operation control signal from the master slice to the plurality of slave slices,
   wherein the at least one of the plurality of through-silicon vias is configured to be shared by the plurality of slave slices,
   wherein one of the plurality of slave slices is configured to be selected by a slave selection signal from the master slice, and selected the one of the plurality of slave slices is configured to receive the operation control signal.

2. The three-dimensional stacked semiconductor integrated circuit according to claim 1, wherein the operation control signal is configured to control active and precharge operations of the plurality of slave slices.

3. The three-dimensional stacked semiconductor integrated circuit according to claim 1, wherein the master slice is configured to transmit the operation control signal in a form of a pulse.

4. The three-dimensional stacked semiconductor integrated circuit according to claim 1, wherein at least one of the plurality of through-silicon vias is configured to transmit the slave selection signal from the master slice to the plurality of slave slices and is configured to be shared by the plurality of slave slices.

5. The three-dimensional stacked semiconductor integrated circuit according to claim 4, wherein the plurality of slave slices are configured to compare specific slice identification information previously set in the plurality of slave slices with the slave selection signal and perform an operation corresponding to the operation control signal.

6. A three-dimensional stacked semiconductor integrated circuit comprising:
   a master slice configured to generate a master active control signal and a slice selection signal in response to a command and generate a pulse signal based on the master active control signal;
   a plurality of slave slices configured to be selected one of the plurality of slave slices by the slice selection signal, and selected the one of the plurality of slave slices is configured to convert the pulse signal to a slave active control signal; and
   a plurality of through-silicon vias configured to be commonly connected between the master slice and the plurality of slave slices for transferring the pulse signal and the slice selection signal.

7. The three-dimensional stacked semiconductor integrated circuit according to claim 6, wherein the pulse signal comprises a signal for defining active start timing and a signal for defining precharge start timing.

8. The three-dimensional stacked semiconductor integrated circuit according to claim 6, wherein the master slice comprises:
   a decoding block configured to decode a command and generate the master active control signal and the slice selection signal; and
   a pulse generation unit configured to generate the pulse signal based on the master active control signal.

9. The three-dimensional stacked semiconductor integrated circuit according to claim 8, wherein the master slice further comprises a driver configured to drive the pulse signal and the slice selection signal so as to be transmitted through the plurality of through-silicon vias.

10. The three-dimensional stacked semiconductor integrated circuit according to claim 8, wherein the pulse generation unit comprises:
    a first pulse generator configured to generate a pulse signal for defining active start timing in response to a rising edge of the master active control signal; and
    a second pulse generator configured to generate a pulse signal for defining precharge start timing in response to a falling edge of the master active control signal.

11. The three-dimensional stacked semiconductor integrated circuit according to claim 6, wherein the plurality of slave slices are configured to convert the pulse signal to the slave active control signal when the slice selection signal coincides with slice identification information set in the plurality of slave slices.

12. The three-dimensional stacked semiconductor integrated circuit according to claim 6, wherein each of the plurality of slave slices comprises:
    an identification information storage unit configured to store its own slice identification information; and
    a signal conversion unit configured to convert the pulse signal to the slave active control signal when the slice selection signal coincides with the slice identification information.

13. The three-dimensional stacked semiconductor integrated circuit according to claim 12, wherein each of the plurality of slave slices further comprises:
    a plurality of memory banks; and
    a bank control unit configured to control active and precharge operations of the plurality of memory banks in response to the slave active control signal.

14. The three-dimensional stacked semiconductor integrated circuit according to claim 12, wherein the signal conversion unit comprises:
    an activation section configured to activate a selection activation signal when the slice selection signal coincides with the slice identification information; and
    a signal conversion section configured to convert the pulse signal to the slave active control signal when the selection activation signal is activated.

15. The three-dimensional stacked semiconductor integrated circuit according to claim 6, wherein the master active control signal and the slave active control signal are level signals configured to define active and precharge according to their levels.

16. A method of controlling a stacked semiconductor integrated circuit having a master slice and a plurality of slave slices, the method comprising:
- generating a master active control signal and a slice selection signal in response to a command;
- generating a pulse signal based on the master active control signal in the master slice;
- transmitting the master active control signal and the slice selection signal to the plurality of slave slices through a plurality of through-silicon vias shared by the plurality of slave slices; and
- converting the pulsed signal to a slave active control signal at selected one of the plurality of slave slices by the slice selection signal.

17. The method of claim 16, further comprising storing slice identification information in each of the plurality of slave slices, wherein converting the pulsed signal to the slave active control signal occurs when the slice selection signal coincides with the slice identification information.

18. The method of claim 16, wherein the pulse signal comprises a signal for defining active start timing and a signal for defining precharge start timing.

19. The method of claim 16, wherein generating the pulse signal comprises:
- generating a pulse signal for defining active start timing in response to a rising edge of the master active control signal; and
- generating a pulse signal for defining precharge start timing in response to a falling edge of the master active control signal.

* * * * *